US007557037B2

(12) United States Patent
Sunohara

(10) Patent No.: US 7,557,037 B2
(45) Date of Patent: Jul. 7, 2009

(54) METHOD OF MANUFACTURING SEMICONDUCTOR CHIP

(75) Inventor: Masahiro Sunohara, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 372 days.

(21) Appl. No.: 11/523,576

(22) Filed: Sep. 20, 2006

(65) Prior Publication Data

US 2007/0065980 A1 Mar. 22, 2007

(30) Foreign Application Priority Data

Sep. 21, 2005 (JP) .......................... P2005-274242

(51) Int. Cl.
*H01L 21/44* (2006.01)

(52) U.S. Cl. ...................... 438/667; 438/613; 438/668; 257/E21.597

(58) Field of Classification Search ................. 438/118, 438/613, 666, 668, 667
See application file for complete search history.

(56) References Cited

U.S. PATENT DOCUMENTS

2006/0043535 A1* 3/2006 Hiatt ......................... 257/621

FOREIGN PATENT DOCUMENTS

JP 2001-060654 3/2001

* cited by examiner

*Primary Examiner*—Thanhha Pham
(74) *Attorney, Agent, or Firm*—Drinker Biddle & Reath LLP

(57) ABSTRACT

A insulation film removing tape 38 is pasted on a metal film 34 so as to cover an opening portion 32, then an insulation film 17 is formed so as to cover the side wall of a through hole 21 from the second major surface 11B side of the semiconductor substrate 11, and thereafter the insulation film removing tape 38 is removed.

4 Claims, 10 Drawing Sheets

17 38 A 32 A 34 11 21 17

METHOD OF MANUFACTURING SEMICONDUCTOR CHIP

TECHNICAL FIELD

The present disclosure relates to a method of manufacturing a semiconductor chip and, in particular, relates to a method of manufacturing a semiconductor chip having through vias electrically coupled to electrode pads, respectively.

RELATED ART

According to the tendency of the high performance and the miniaturization of electronic devices in recent years, the development has been made as to a multi chip package in which plural semiconductor chips are laminated. A semiconductor chip applied to the multi chip package has through vias for electrically coupling the other semiconductor chips stacked in the vertical direction.

FIG. 16 is a sectional view showing a semiconductor chip having through vias according to a related technique.

As shown in FIG. 16, a semiconductor chip 100 includes a semiconductor substrate 101, a not-shown semiconductor elements, electrode pads 102, an insulation film 103 and through vias 105. The semiconductor substrate 101 is provided with through holes 106 which penetrate the semiconductor substrate 101 to expose the electrode pads 102, respectively. The semiconductor elements (not shown) are provided on the first major surface 101A side of the semiconductor substrate 101. The electrode pads 102 are provided on the first major surface 101A side of the semiconductor substrate 101 and electrically coupled to the semiconductor elements via not-shown wirings. The insulation film 103 is provided so as to cover the side walls of the through holes 106 and the second major surface 101B (a non-active surface) of the semiconductor substrate 101. The through vias 105 are provided at the through holes 106 and electrically coupled to the electrode pads 102, respectively.

FIGS. 17 to 20 are views showing the manufacturing procedure of the semiconductor chip having through vias of the related technique. In FIGS. 17 to 20, portions identical to those of the semiconductor chip 100 shown in FIG. 16 are referred to by the common symbols.

The manufacturing method of the semiconductor chip 100 will be explained with reference to FIGS. 17 to 20. As shown in FIG. 17, the not-shown semiconductor elements, the wiring and the electrode pads 102 are formed on the first major surface 101A of the semiconductor substrate 101 according to the known method. Thereafter, the semiconductor substrate 101 is etched by the wet etching method from the second major surface 101B side of the semiconductor substrate 101 to form the through holes 106 which respectively expose the electrode pads 102.

Then, as shown in FIG. 18, the insulation film 103 is formed so as to cover the upper surface of the structure shown in FIG. 17. Next, a resist film 108, having opening portions 108A for respectively exposing the insulation film 103 provided at the electrode pads 102, is formed on the insulation film 103.

Next, as shown in FIG. 19, the insulation film 103 provided on the electrode pads 102 is removed by the etching method using the resist film 108 as a mask. The dry etching method or the wet etching method is used as the etching method.

Then, as shown in FIG. 20, the resist film 108 is removed, and solder paste is filled into the through holes 106 by the printing method thereby to form the through vias 105. As a result, manufacturing procedure of the semiconductor chip 100 is completed (see patent document 1: Japanese Patent Unexamined Publication No. 2001-60654, for example).

However, in the case of removing the insulation film 103 provided on the electrode pads 102 by using the wet etching method, the necessary portions of the insulation film 103 formed on the side walls of the semiconductor substrate 101 are also removed depending on an over-etch amount, so that there arises a problem that the yield of the semiconductor chip 100 degrades.

Further, in the case of removing the insulation film 103 provided on the electrode pads 102 by using the wet etching method, the electrode pads 102 are damaged depending on an over-etch amount, so that there also arises a problem that the yield of the semiconductor chip 100 degrades.

SUMMARY

Embodiments of the present invention provide a method of manufacturing a semiconductor chip which can improve the yield.

According to an aspect of the invention, there is provided with a method of manufacturing a semiconductor chip having an electrode pad electrically coupled to a semiconductor element formed on a semiconductor substrate and a through via electrically coupled to the electrode pad, comprising:

a resist film forming step of forming a resist film having an opening portion on the electrode pad;

a through hole forming step of forming a through hole which penetrates the electrode pad and a portion of the semiconductor substrate corresponding to a position where the opening portion is formed and has a diameter smaller than the diameter of the opening portion;

an insulation film removing tape pasting step of pasting an insulation film removing tape on the resist film;

an insulation film forming step of forming an insulation film covering at least the side wall of the through hole after the insulation film removing tape pasting step; and an insulation film removing tape removing step of removing the insulation film removing tape.

According to the invention, since the insulation film removing tape covering the opening portion is pasted on the resist film and the insulation film is formed so as to cover at least the side wall of the through hole, the thickness of the insulation film at a step portion constituted by the opening portion and the through hole having a diameter smaller than that of the opening portion can be rendered to be thinner than the insulation film formed at the through hole. Thus, at the time of removing the insulation film removing tape, since the insulation film can be broken at the step portion and so the side wall of the through hole can be covered by the insulation film with a high accuracy, the yield of the semiconductor chip can be improved.

Various implementations may include one or more the following advantages. For example, the yield of the semiconductor chip having through vias to be electrically coupled to electrode pads, respectively, can be improved.

Other features and advantages may be apparent from the following detailed description, the accompanying drawings and the claims.

DETAILED DESCRIPTION

Next, an embodiment of the invention will be explained with reference to the drawings.

Figure 1:
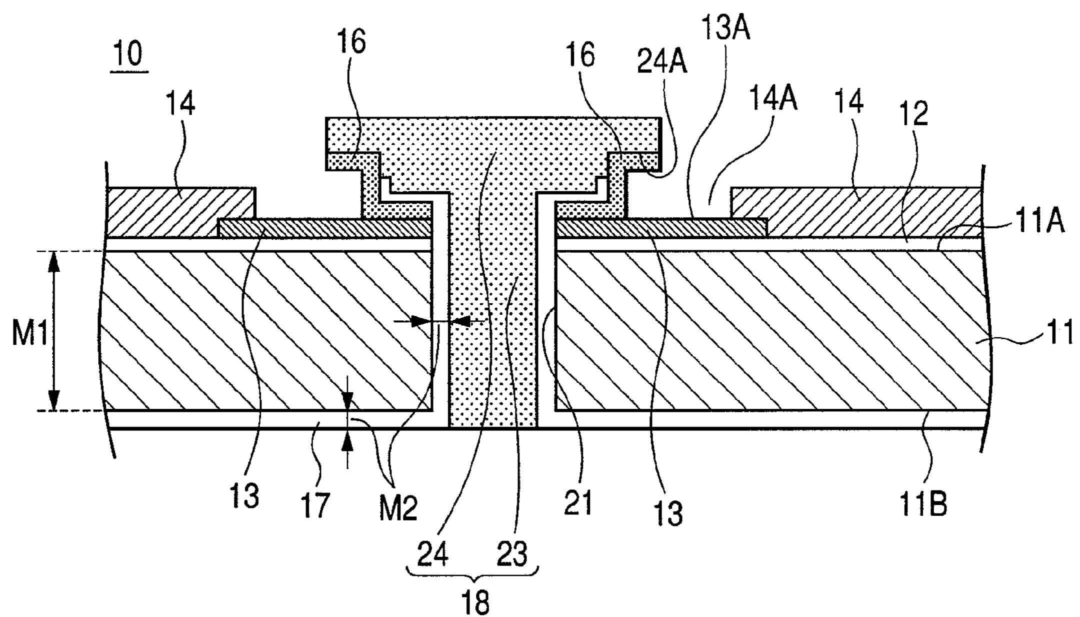
FIG. 1 is a sectional view showing a semiconductor chip according to the embodiment of the invention

FIG. 1 is a sectional view showing a semiconductor chip according to the embodiment of the invention.

With reference to FIG. 1, a semiconductor chip 10 includes a semiconductor substrate 11, a semiconductor element (not shown), insulation films 12, 17, an electrode pad 13, a protection film 14, a conductive member 16 and a through via 18.

The semiconductor substrate 11 is made thin and provided with a through hole 21 for disposing the through via 18 therein, respectively. The through hole 21 penetrates the semiconductor substrate 11, the insulation film 12 and the electrode pad 13. The material of the semiconductor substrate 11 is semiconductor such as silicon or GaAs. The thickness M1 of the thinned semiconductor substrate 11 is 200 μm, for example.

The semiconductor element (not shown) is an element such as transistor and provided on the first major surface 11A side of the semiconductor substrate 11. The semiconductor element is electrically coupled to the electrode pad 13 via not-shown wiring.

The insulation film 12 is provided so as to cover the first major surface 11A side of the semiconductor substrate 11. The insulation film 12 is a film which insulates between the semiconductor substrate 11 and the electrode pad 13. The insulation film 12 is formed by the CVD method, for example. An $SiO_2$ film or an SiN film, for example, is used as the insulation film 12. The thickness of the insulation film 12 is 0.1 μm, for example.

The electrode pad 13 is provided on the insulation film 12. The electrode pad 13 is electrically coupled to the semiconductor element (not shown) via not-shown wiring. Al, for example, is used as the material of the electrode pad 13. The electrode pad 13 is formed in a manner, for example, that an Al film is formed on the insulation film 12 by the sputtering method and the Al film is subjected to the patterning process by the dry etching method.

The protection film 14 is provided so as to cover the insulation film 12 and has an opening portion 14A for exposing the electrode pad 13. The diameter of the opening portion 14A is 120 μm, for example. The protection film 14 is formed by the CVD method, for example. For example, an $SiO_2$ film or a laminated film of an $SiO_2$ film and an SiN film etc. is used as the protection film 14.

The conductive member 16 is provided between the protrusion portion 24 of the through via 18 and the electrode pad 13 and contacts to the lower surface 24A of the protrusion portion 24 and the upper surface 13A of the electrode pad 13. The conductive member 16 is used to electrically couple the protrusion portion 24 of the through via 18 and the electrode pad 13. The conductive member 16 is formed by the sputtering method, the CVD method or the electroless plating etc., for example. Conductive metal is used as the material of the conductive member 16. To be concrete, a Ti/Cu laminated film formed by sequentially laminating a Ti film and a Cu film or a Cr/Cu laminated film formed by sequentially laminating a Cr film and a Cu film etc. is used as the material of the conductive member.

The insulation film 17 is provided on the second major surface 11B of the semiconductor substrate 11, on the side wall of the through hole 21 and between the conductive member 16 and the through via 18. The insulation film 17 is a film for insulating between the semiconductor substrate 11 and the through via 18. The insulation film 17 is formed by the CVD method, for example. For example, an $SiO_2$ film or an SiN film etc. is used as the insulation film 17. The thickness M2 of the thinned insulation film 17 is 1 μm, for example.

The through via 18 includes a penetrating portion 23 and the protrusion portion 24. The penetrating portion 23 is provided at the through hole 21 at which the insulation film 17 is formed. The protrusion portion 24 is integrally formed at the upper end portion of the penetrating portion 23. In the case of laminating another semiconductor chip on the semiconductor chip 10 in the vertical direction thereby to constitute a multi chip package, the through via (not shown) of the another semiconductor chip is electrically coupled to the lower end portion 23A of the penetrating portion 23.

The protrusion portion 24 is provided on the conductive member 16 and on the insulation film 17 located above the electrode pad 13. The protrusion portion 24 is formed to have a width larger than the penetrating portion 23. The upper end portion (a portion of the protrusion portion 24 located on the conductive member 16) of the protrusion portion 24 is formed to have a width larger than a portion of the protrusion portion 24 located near the penetrating portion 23. In the case of laminating another semiconductor chip on the semiconductor chip 10 in the vertical direction thereby to constitute a multi chip package, the through via (not shown) of the another semiconductor chip is electrically coupled to the protrusion portion 24.

The through via 18 is formed by the plating method, for example. Conductive metal is used as the material constituting the through via 18, for example. To be concrete, Cu is used as the material constituting the though via-holes, for example. Further, the conductive member 16 can be used as a feeding layer at the time of forming the protrusion portion 24.

FIGS. 2 to 14 are views showing the manufacturing procedure of the semiconductor chip according to the embodiment. In FIGS. 2 to 14, portions identical to those of the semiconductor chip 10 explained above with reference to FIG. 1 are referred to by the common symbols.

The manufacturing method of the semiconductor chip 10 according to this embodiment will be explained with reference to F FIGS. 2 to 14.

Figure 2:
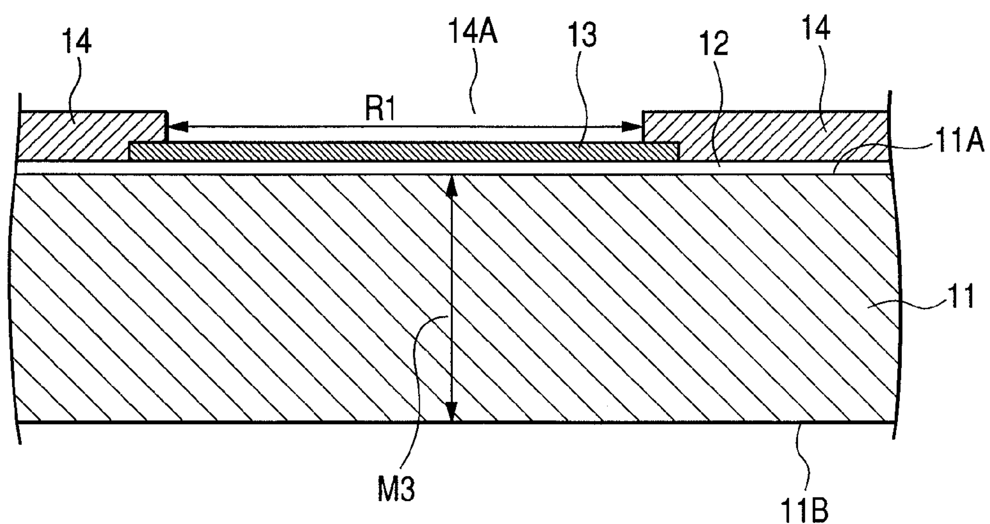
FIG. 2 is a (first) view showing the manufacturing procedure of the semiconductor chip according to the embodiment.

First, as shown in FIG. 2, the not-shown semiconductor element is formed on the first major surface 11A of the semiconductor substrate 11 before being thinned according to the known technique, and the insulation film 12, the electrode pad 13 and the protection film 14 are sequentially formed on the first major surface 11A of the semiconductor substrate 11.

To be concrete, for example, an $SiO_2$ film (a thickness of 0.1 μm) is formed as the insulation film 12 by the CVD method. Next, an Al film is formed on the insulation film 12 by the sputtering method, for example. Then, a resist film, which is patterned so as to correspond to the shape of the electrode pad 13, is formed on the Al film. Thereafter, the Al film is etched by the dry etching method using the resist film as a mask thereby to form the electrode pad 13. Next, an $SiO_2$ film is formed as the protection film 14 by the CVD method, for example, on the insulation film 12 on which the electrode pad 13 is formed. Next, a resist film having opening portion corresponding to the shape of the opening portion 14A is formed on the $SiO_2$ film, and the $SiO_2$ film is etched by the dry etching method using the resist film as a mask thereby to form the opening portion 14A.

The diameter R1 of the opening portion 14A is 120 μm, for example. In place of the $SiO_2$ film, an SiN film (a thickens of 0.1 μm, for example) may be formed as the insulation film 12 by the CVD method. The thickness M3 of the semiconductor substrate 11 before being thinned is 725 μm, for example.

Figure 3:
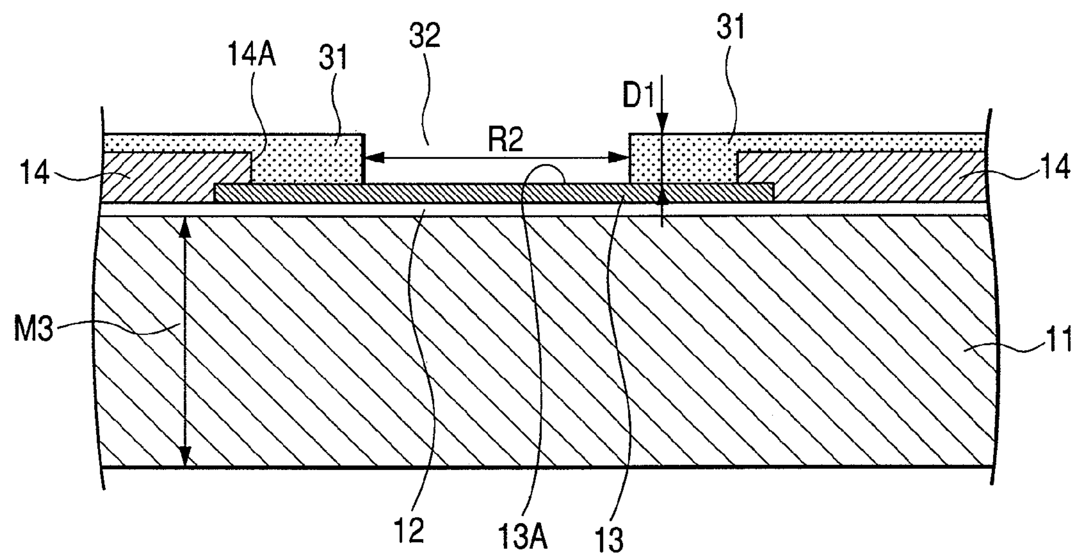
FIG. 3 is a (second) view showing the manufacturing procedure of the semiconductor chip according to the embodiment.

Next, as shown in FIG. 3, a resist film 31 having an opening portion 32 for exposing the upper surfaces 13A of the electrode pad 13 is formed on the structure shown in FIG. 2 (a resist film forming step). The diameter R2 of the opening portion 32 is 90 μm, for example. Further, the depth D1 of the opening portion 32 is 10 μm, for example.

Figure 4:
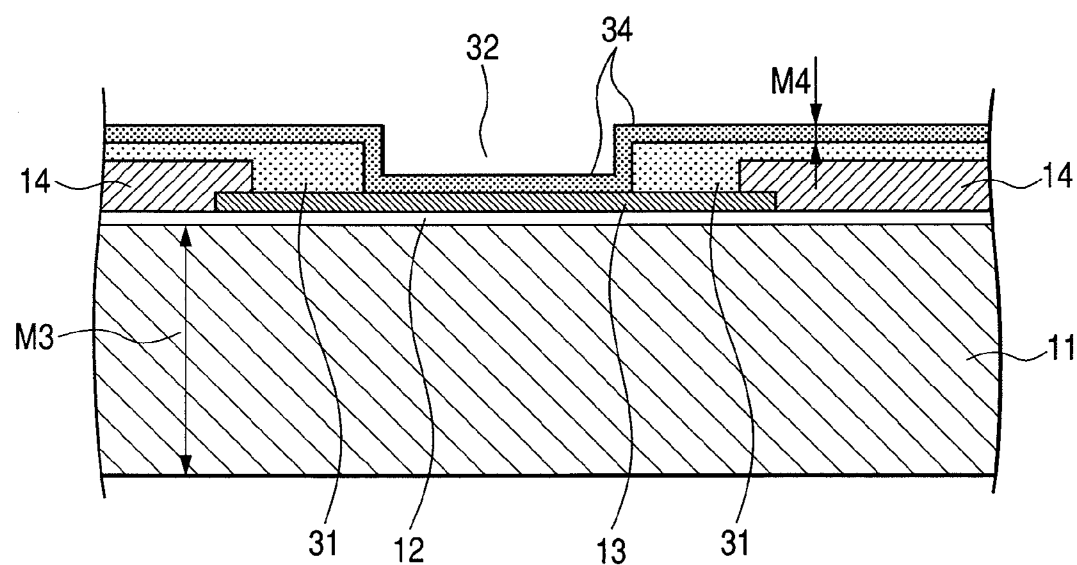
FIG. 4 is a (third) view showing the manufacturing procedure of the semiconductor chip according to the embodiment.

Next, as shown in FIG. 4, a metal film 34 is formed so as to cover the opening portion 32 and the resist film 31. The metal film 34 is formed by the sputtering method, the CVD method or the electroless plating etc., for example. A Ti/Cu laminated film formed by sequentially laminating a Ti film and a Cu film or a Cr/Cu laminated film formed by sequentially laminating a Cr film and a Cu film etc. is used as the material of the metal film 34, for example. When the Ti/Cu laminated film is used as the metal film 34, the thickness M4 of the metal film 34 can be set in a manner that the Ti layer has a thickness of 50 nm and the Cu layer has a thickness of 500 nm. The metal film 34 is subjected to the patterning process in the later process thereby to be formed as the conductive member 16.

Figure 5:
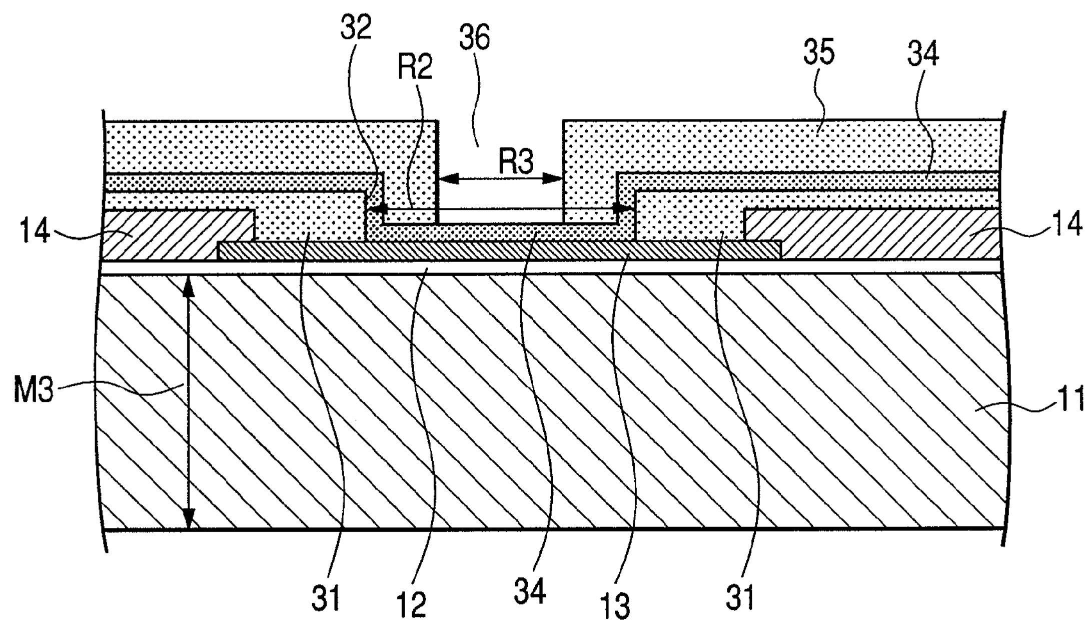
FIG. 5 is a (fourth) view showing the manufacturing procedure of the semiconductor chip according to the embodiment.

Then, as shown in FIG. 5, a resist film 35 having an opening portion 36 is formed on the metal film 34. The opening portion 36 is formed at a portion of the resist film 35 provided at the opening portion 32 so as to expose the metal film 34. The opening portion 36 corresponds to a position where the through hole 21 is formed.

The diameter R3 of the opening portion 36 is set to be smaller than the diameter R2 of the opening portion 32 (R3<R2).

Figure 6:
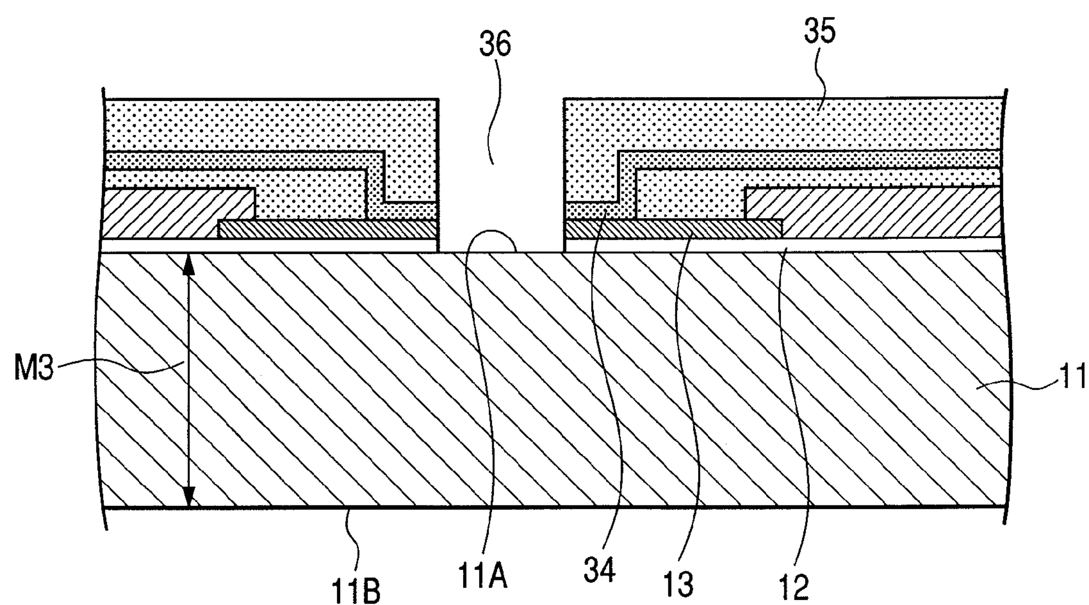
FIG. 6 is a (fifth) view showing the manufacturing procedure of the semiconductor chip according to the embodiment.

Next, as shown in FIG. 6, the metal film 34, the electrode pad 13 and the insulation film 12 are sequentially etched by using the resist film 35 as a mask thereby to expose the first major surface 11A of the semiconductor substrate 11.

To be concrete, for example, when the Ti/Cu laminated film is used as the metal film 34, the Cu film exposed at the opening portion 36 is removed by the wet etching method, and the Ti film, the Al film (corresponding to the electrode pad 13) and the $SiO_2$ film (corresponding to the insulation film 12) are sequentially etched away by the dry etching method.

Figure 7:
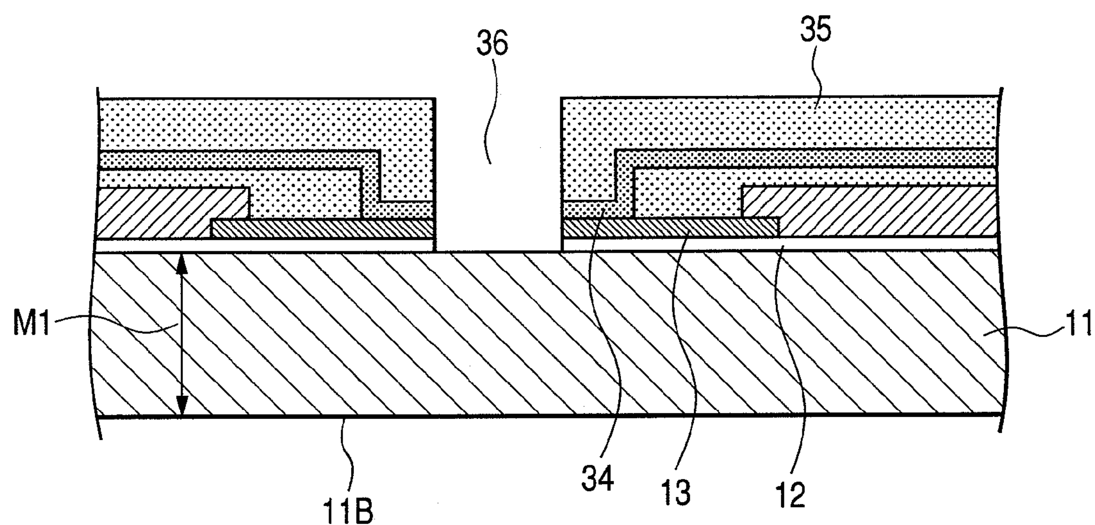
FIG. 7 is a (sixth) view showing the manufacturing procedure of the semiconductor chip according to the embodiment.

Then, as shown in FIG. 7, the semiconductor substrate 11 is thinned from the second major surface 11B side (a substrate thinning step) The grinding method or the etching method, for example, can be used in order to thin the semiconductor substrate 11. To be concrete, the semiconductor substrate is thinned by using a grinder, for example, until the thickness M1 of the semiconductor substrate reduces to 200 μm.

In this manner, since the semiconductor substrate 11 is thinned before the through hole 21 is formed, the aspect ratio of the through hole 21 can be made small, whereby the through hole 21 can be formed easily.

Figure 8:
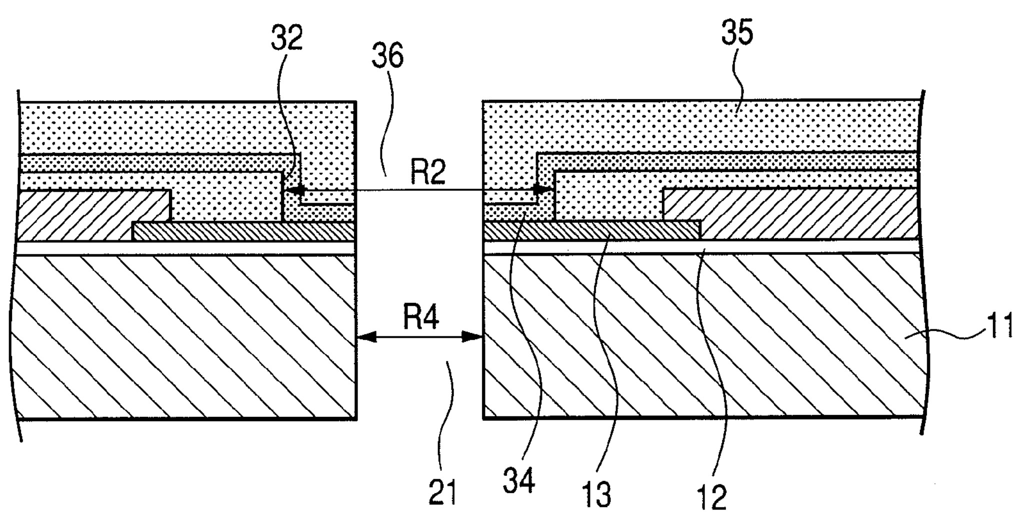
FIG. 8 is a (seventh) view showing the manufacturing procedure of the semiconductor chip according to the embodiment.

Next, as shown in FIG. 8, the semiconductor substrate 11 is etched by the dry etching method using the resist film 35 as a mask until the semiconductor substrate 11 is penetrated thereby to form the through hole 21 (a through hole forming step). The diameter R4 of the through hole 21 is set to be smaller than the diameter R2 of the opening portion 32 (R4<R2).

Figure 9:
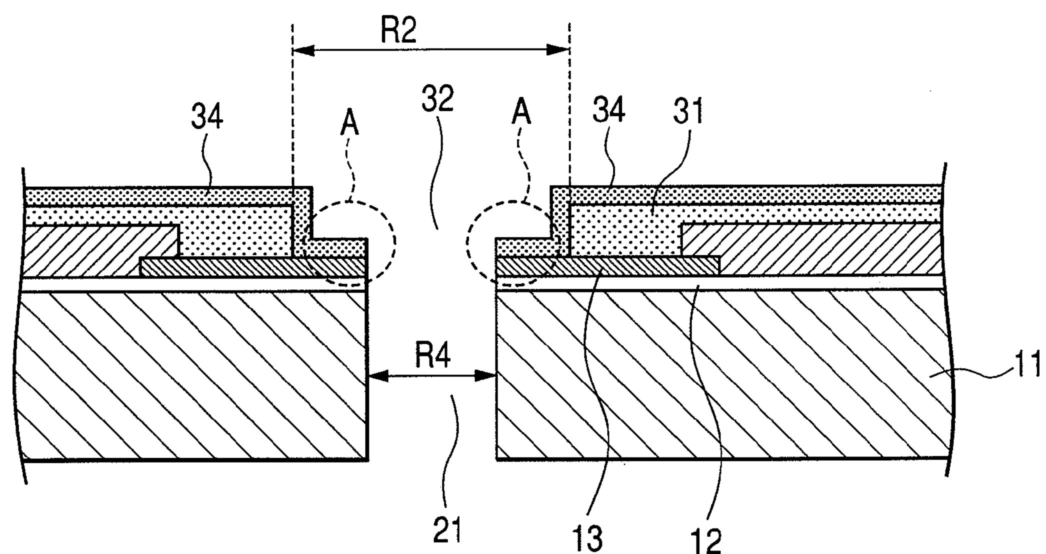
FIG. 9 is a (eighth) view showing the manufacturing procedure of the semiconductor chip according to the embodiment.

Then, as shown in FIG. 9, the resist film 35 is removed. The resist film 35 can be removed by the $O_2$ ashing, for example. Further, since there is a difference between the diameter R2 of the opening portion 32 and the diameter R4 of the through hole 21, a step portion A is formed between the through hole 21 and a portion of the opening portion 32 where the metal film 34 is formed.

Figure 10:
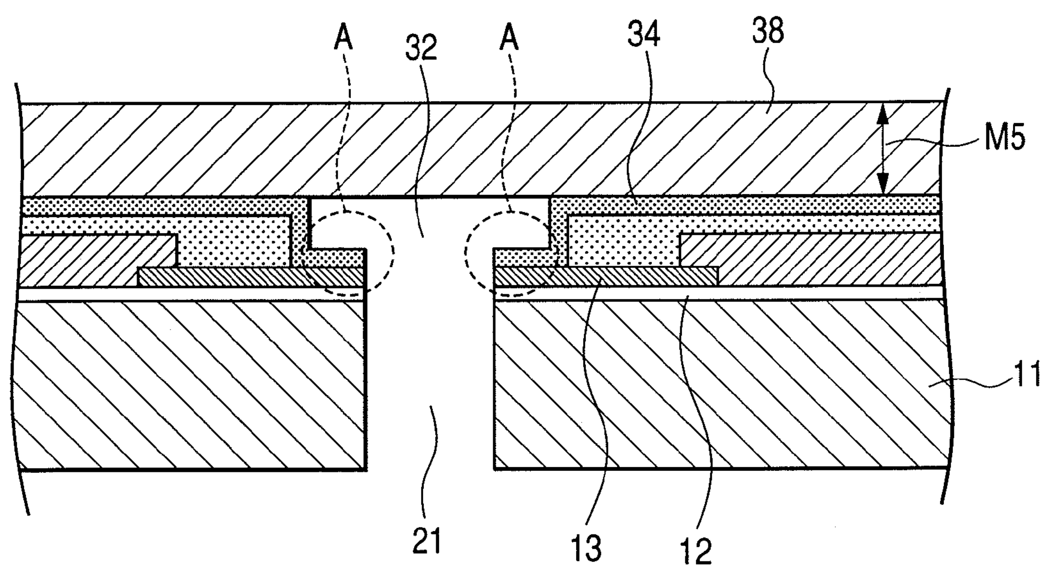
FIG. 10 is a (ninth) view showing the manufacturing procedure of the semiconductor chip according to the embodiment.

Next, as shown in FIG. 10, an insulation film removing tape 38 is pasted on the metal film 34 of the structure shown in FIG. 9 so as to cover the upper end portions of the opening portion 32 (an insulation film removing tape pasting step). A tape formed by forming acrylic adhesive on a PET base material, for example, can be used as the insulation film removing tape 38. The thickness M5 of the insulation film removing tape 38 is in a range of 100 μm to 200 μm, for example.

Figure 11:
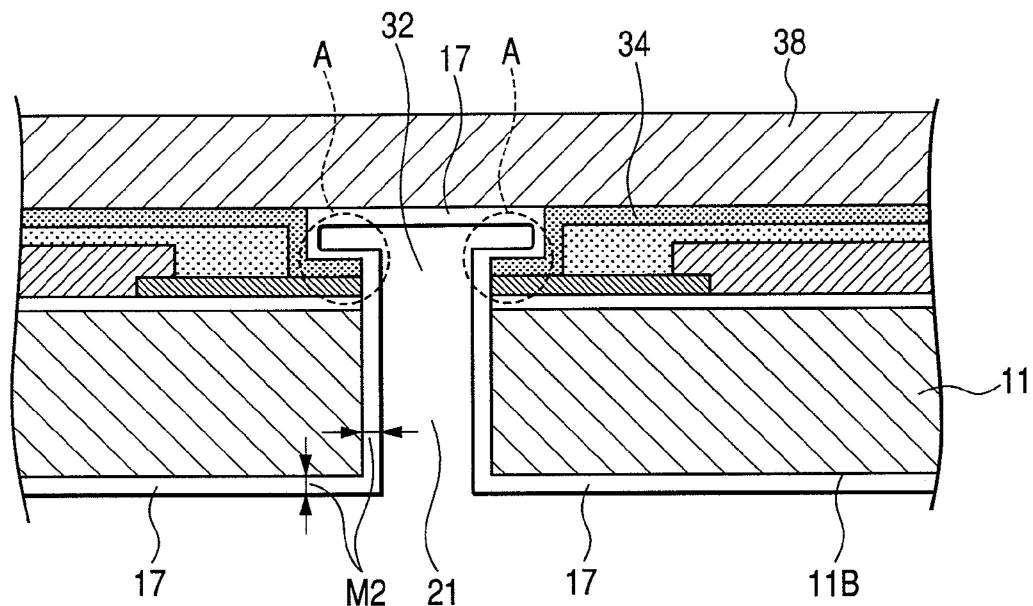
FIG. 11 is a (tenth) view showing the manufacturing procedure of the semiconductor chip according to the embodiment.

Then, as shown in FIG. 11, the insulation film 17 is formed on the side wall of the through hole 21 from the second major surface 11B side of the semiconductor substrate 11 (a insulation film forming step). In this case, the insulation film 17 is formed on the second major surface 11B of the semiconductor substrate 11 and the side wall of the opening portion 32 and also on the insulation film removing tape 38. To be concrete, the $SiO_2$ film is formed so as to have a thickness of 1 μm on the sidewall of the through hole 21 and the second major surface 11B of the semiconductor substrate 11.

In this manner, since the insulation film 17 is formed on the side wall of the through hole 21 from the second major surface 11B side of the semiconductor substrate 11, the thickness of the insulation film 17 formed at the opening portion 32 at which the metal film 34 is provided is rendered to be thinner than the thickness M2 of the insulation film 17 formed on the side wall of the through hole 21, whereby the strength of the insulation film 17 formed at the step portion A can be made weaken.

Figure 12:
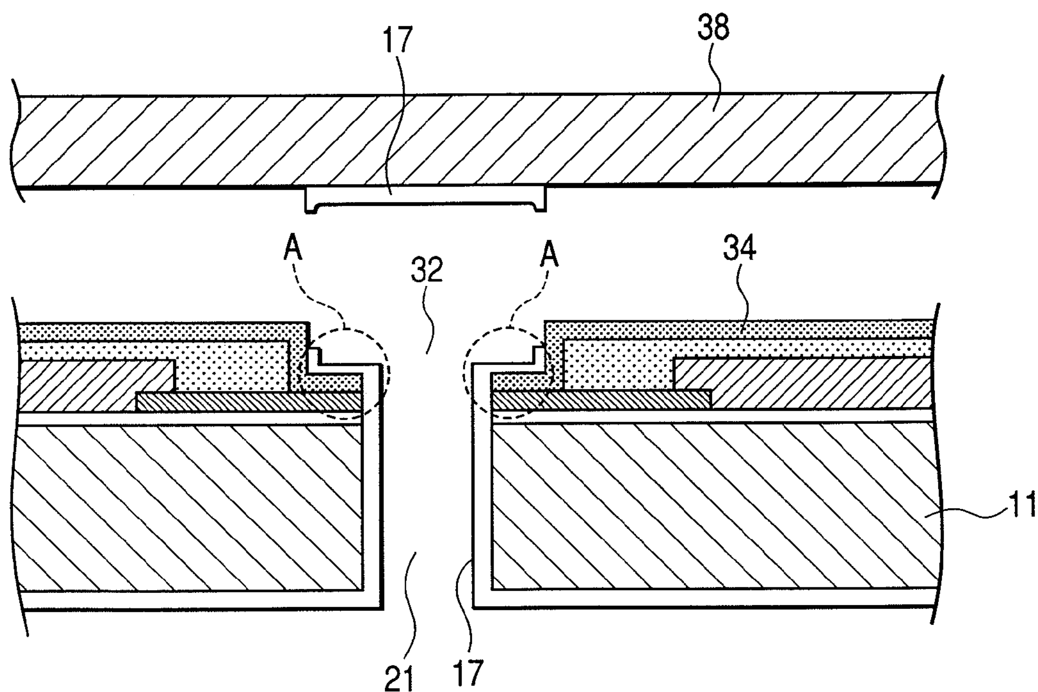
FIG. 12 is a (eleventh) view showing the manufacturing procedure of the semiconductor chip according to the embodiment.

Next, as shown in FIG. 12, the insulation film removing tape 38 on which the insulation film 17 is formed is removed from the metal film 34 (an insulation film removing tape removing step). In this case, the insulation film 17 is broken at the step portion A which is thin in the thickness and has a weak strength, and an unnecessary portion of the insulation film 17 (the insulation film 17 remained on the insulation film removing tape 38) is removed together with the insulation film removing tape 38.

In this manner, since the insulation film removing tape 38 covering the opening portion 32 is pasted on the metal film 34 and the insulation film 17 is formed so as to cover the side wall of the through hole 21 from the second major surface 11B side of the semiconductor substrate 11, the thickness of the portion of the insulation film 17 corresponding to the step portion A can be rendered to be thinner than the thickness of the portions of the insulation film 17 formed on the side wall of the through hole 21. Thus, at the time of removing the insulation film removing tape 38, since the insulation film 17 can be broken at the step portion A, and the side wall of the through hole 21 can be covered by the insulation film 17 with a high accuracy, the yield of the semiconductor chip 10 can be improved.

Even in a case where the insulation film 17 having same thickness as that of the side wall of the through hole 21 is formed on the side wall of the opening portion 32, since the strength of the insulation film 17 formed at the corner portion of the step portion A is weaker than the strength of the insulation film 17 formed on the side wall of the through hole 21, the insulation film 17 is broken at the step portion A in the case of removing the insulation film removing tape 38.

Figure 13:
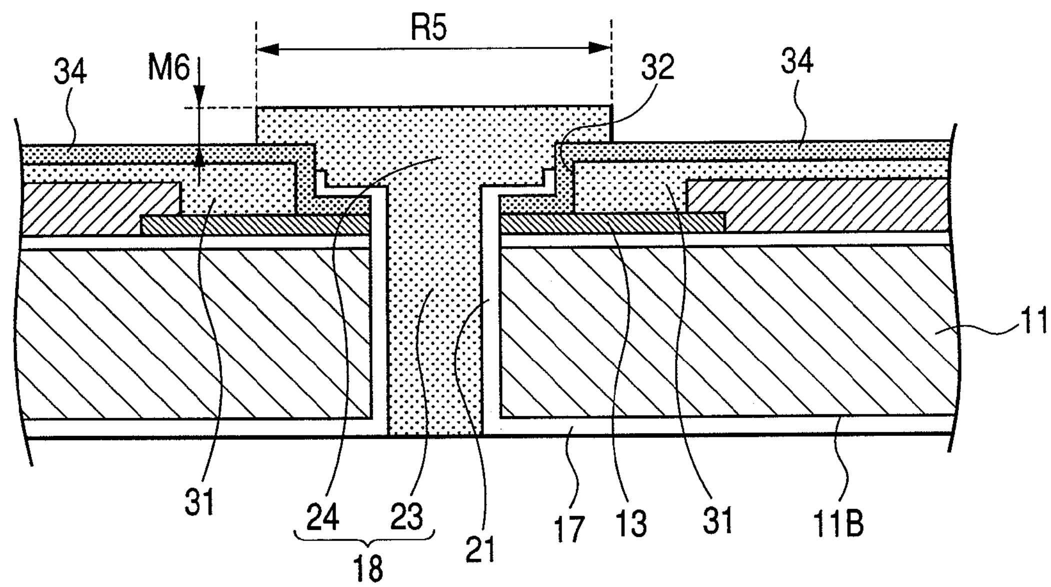
FIG. 13 is a (twelfth) view showing the manufacturing procedure of the semiconductor chip according to the embodiment.

Then, as shown in FIG. 13, the penetrating portion 23 is formed in the through hole 21 at which the insulation film 17 is formed and also the protrusion portion 24 protruding from the opening portion 32 is formed at the opening portion 32 at which the insulation film 17 and the metal film 34 are formed (a through via forming step). Thus, the through via 18 constituted by the penetrating portion 23 and the protrusion portion 24 is formed.

To be concrete, for example, a resist film patterned so as to correspond to the shape of the protrusion portion 24 is formed on the metal film 34, then a metal plate (a Cu plate, for example) is disposed on the insulation film 17 formed on the second major surface 11B side of the semiconductor substrate 11, and the conductive metal (a Cu, for example) is deposited on the through hole 21 and the opening portion 32 by the electrolytic plating method using the metal plate as a feeding layer thereby to form the through via 18.

The protrusion portion 24 protruded from the opening portion 32 is formed to have a width larger than that of the opening portion 32 and the diameter thereof is 90 μm, for example. Further, the thickness M6 of a portion of the protrusion portion 24 protruded from the opening portion 32 is 5 μm, for example.

Alternatively, conducive metal (Cu, for example) may be deposited on the through hole 21 and the opening portion 32 by the electrolytic plating method using the metal film 34 as a feeding layer thereby to form the through via 18.

Figure 14:
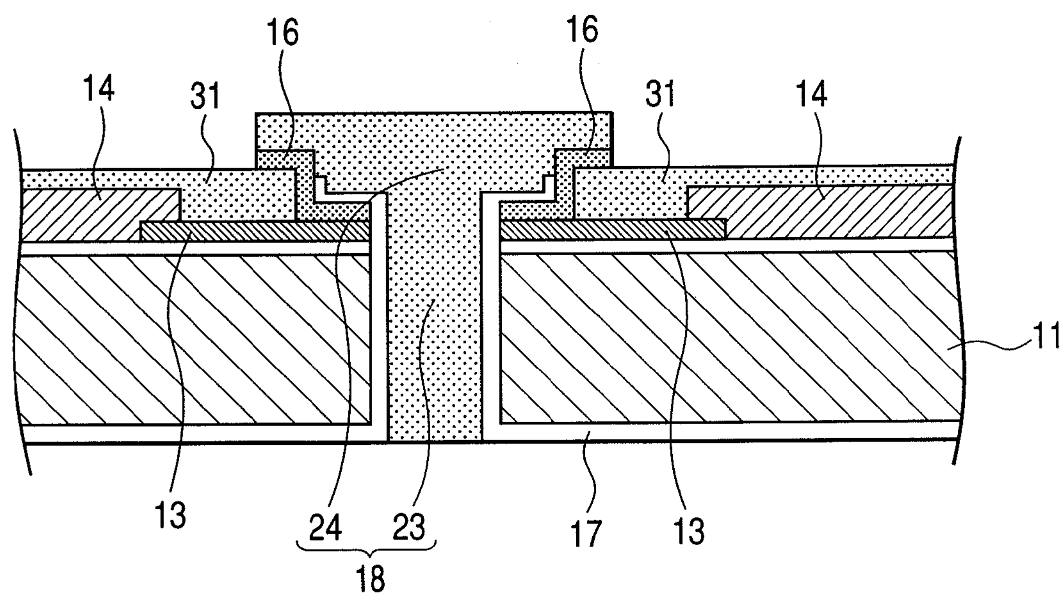
FIG. 14 is a (thirteenth) view showing the manufacturing procedure of the semiconductor chip according to the embodiment.

Next, as shown in FIG. 14, a portion of the metal film 34 not covered by the protrusion portion 24 is removed by the etching method to form the conductive member 16 contacting to the protrusion portion 24 and the electrode pad 13 (a conductive member forming step).

In this manner, since the protrusion portion 24 is formed so as to protrude from the opening portion 32 and the conductive member 16 contacting to the protrusion portion 24 and the electrode pad 13 is formed, the through via 18 can be electrically coupled to the electrode pad 13 via the conductive member 16, respectively.

Figure 15:
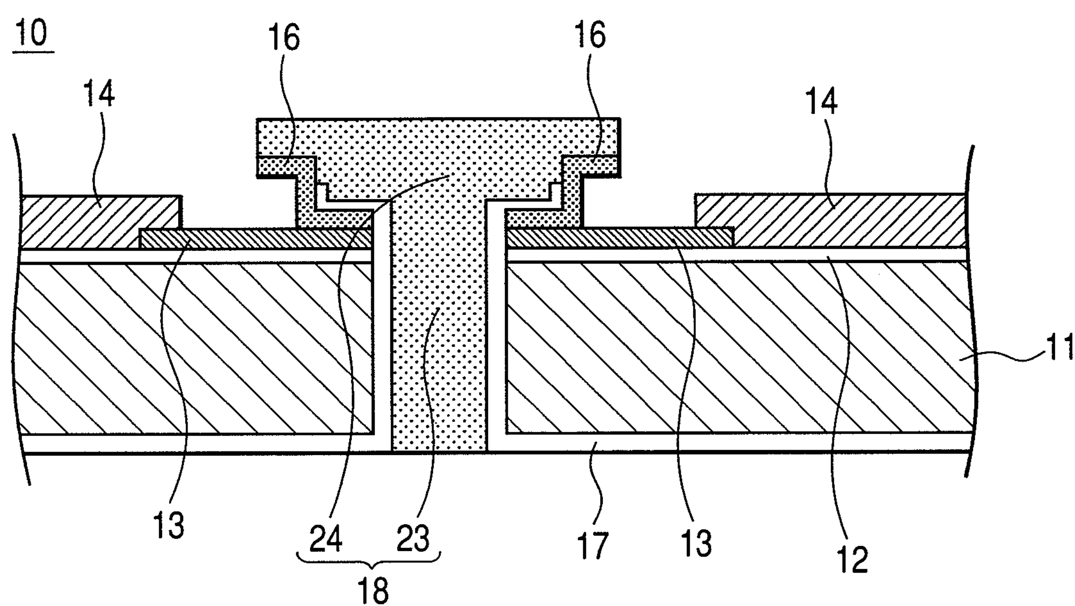
FIG. 15 is a (fourteenth) view showing the manufacturing procedure of the semiconductor chip according to the embodiment.
Figure 16:
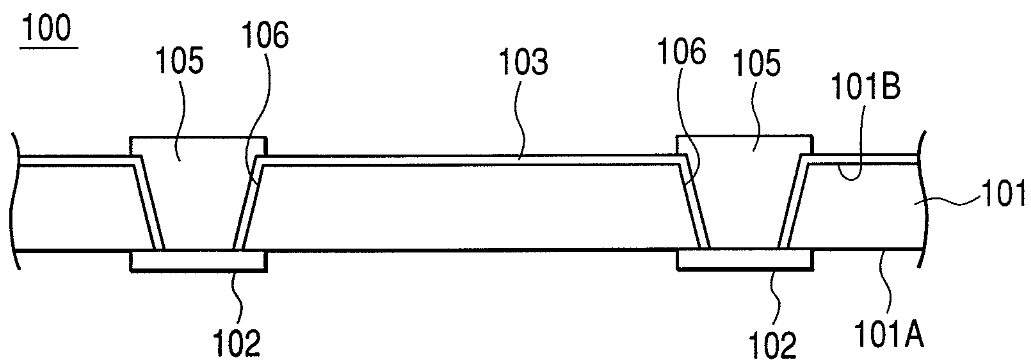
FIG. 16 is a sectional view showing a semiconductor chip having through vias according to a related technique.
Figure 17:
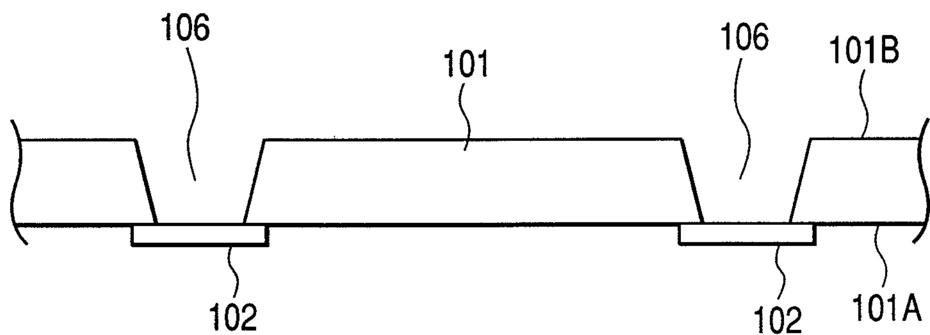
FIG. 17 is a (first) view showing the manufacturing procedure of the semiconductor chip having the through vias of the related technique.
Figure 18:
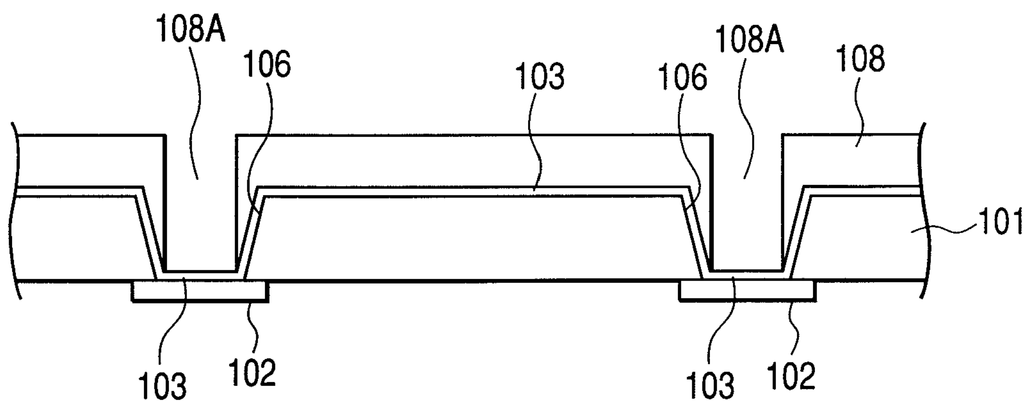
FIG. 18 is a (second) view showing the manufacturing procedure of the semiconductor chip having the through vias of the related technique.
Figure 19:
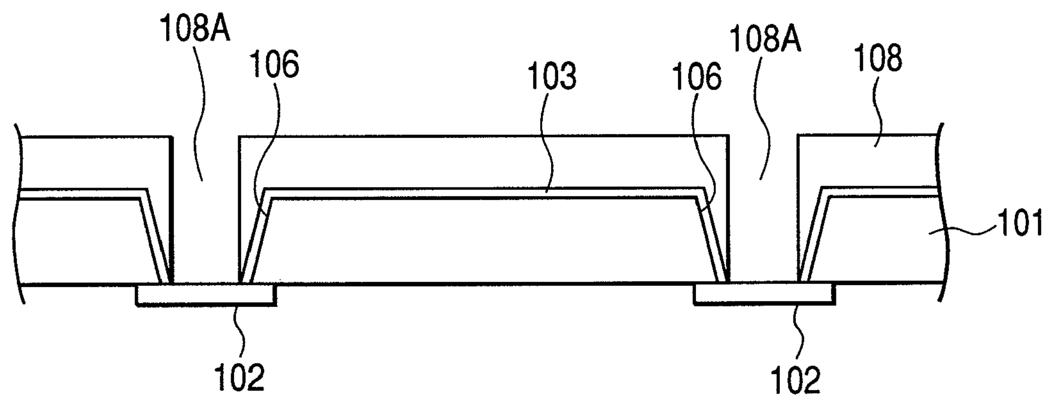
FIG. 19 is a (third) view showing the manufacturing procedure of the semiconductor chip having the through vias of the related technique.
Figure 20:
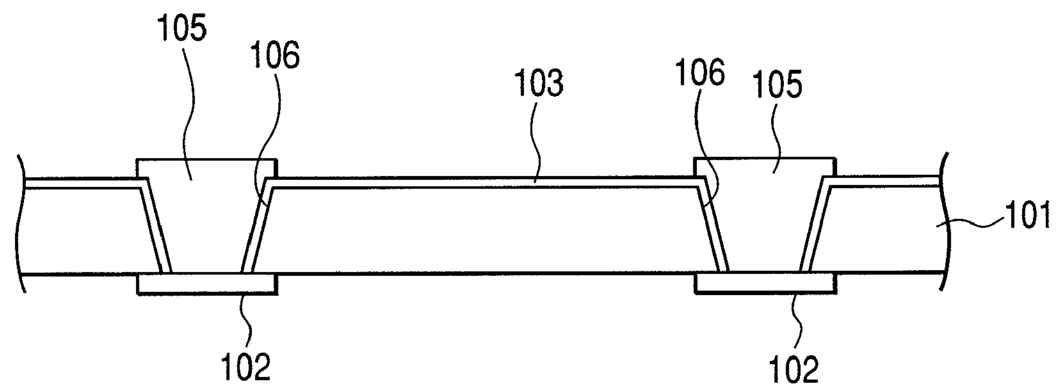
FIG. 20 is a (fourth) view showing the manufacturing procedure of the semiconductor chip having the through vias of the related technique.

Then, as shown in FIG. 15, the resist film 31 is removed. The resist film 31 is removed by the $O_2$ ashing, for example. In this manner, the manufacturing procedure of the semiconductor chip 10 is completed.

According to the manufacturing method of the embodiment, since the insulation film removing tape 38 covering the opening portion 32 is pasted on the metal film 34 and the insulation film 17 is formed so as to cover the side walls of the through hole 21 having the diameter smaller than that of the opening portion 32, the thickness of the insulation film 17 at the step portion A constituted by the through hole 21 and the opening portion 32 can be rendered to be thin, the insulation film 17 is broken at the step portion A at the time of removing the insulation film removing tape 38. Thus, the side wall of the through hole 21 can be covered by the insulation film 17 with a high accuracy and so the yield of the semiconductor chip 10 can be improved.

Although the invention is explained in detail as to the preferred embodiment, the invention is not limited to such the particular embodiment and various changes and modifications can be made within the gist of the invention recited in claims.

The invention can be applied to the manufacturing method of the semiconductor chip which can improve the yield.

What is claimed is:

1. A method of manufacturing a semiconductor chip having an electrode pad electrically coupled to a semiconductor element formed on a semiconductor substrate and a through via electrically coupled to the electrode pad, comprising:

- a resist film forming step of forming a resist film having an opening portion on the electrode pad;
- a through hole forming step of forming a through hole which penetrates the electrode pad and a portion of the semiconductor substrate corresponding to a position where the opening portion is formed and has a diameter smaller than a diameter of the opening portion;
- an insulation film removing tape pasting step of pasting an insulation film removing tape on the resist film;
- an insulation film forming step of forming an insulation film covering at least a side wall of the through hole after the insulation film removing tape pasting step; and
- an insulation film removing tape removing step of removing the insulation film removing tape.

2. A method of manufacturing a semiconductor chip according to claim 1, further comprising:

- a through via forming step of forming the through via at the through hole and the opening portion, the through via having a protrusion portion protruding from the opening portion and having a width larger than a width of the opening portion; and
- a conductive member forming step of forming a conductive member which contacts to the protrusion portion and the electrode pad.

3. A method of manufacturing a semiconductor chip according to claim 1, further comprising:

- a substrate thinning step of thinning the semiconductor substrate before the through hole forming step.

4. A method of manufacturing a semiconductor chip according to claim 2, further comprising:

- a substrate thinning step of thinning the semiconductor substrate before the through hole forming step.

* * * * *